(12) United States Patent
Guan

(10) Patent No.: US 8,248,785 B2
(45) Date of Patent: Aug. 21, 2012

(54) ELECTRONIC DEVICE WITH THERMAL INSULATION MEMBER FOR HEAT SINK

(75) Inventor: Zhi-Bin Guan, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 230 days.

(21) Appl. No.: 12/828,431

(22) Filed: Jul. 1, 2010

(65) Prior Publication Data
US 2011/0279970 A1    Nov. 17, 2011

(30) Foreign Application Priority Data
May 17, 2010 (TW) ................................ 99115627 A

(51) Int. Cl.
H05K 7/20 (2006.01)
F28F 7/00 (2006.01)
H01L 23/34 (2006.01)
(52) U.S. Cl. .............. 361/679.52; 361/679.54; 361/700; 361/709; 165/80.4; 165/80.5; 165/104.33; 257/715; 257/E23.088; 174/15.2
(58) Field of Classification Search ............ 361/679.49, 361/679.51, 679.52, 679.54, 690, 700, 703, 361/709, 719; 165/80.3–80.5, 104.33; 257/715, 257/722; 174/15.2, 16.3, 252
See application file for complete search history.

(56) References Cited

U.S. PATENT DOCUMENTS

| | | | |
|---|---|---|---|
| 6,038,128 A * | 3/2000 | Hood et al. | 361/679.41 |
| 6,094,345 A * | 7/2000 | Diemunsch | 361/695 |
| 6,377,459 B1 * | 4/2002 | Gonsalves et al. | 361/700 |
| 6,504,718 B2 * | 1/2003 | Wu | 361/695 |
| 7,108,051 B2 * | 9/2006 | Hung | 165/122 |
| 7,312,992 B2 * | 12/2007 | Jory et al. | 361/696 |
| 7,403,388 B2 * | 7/2008 | Chang | 361/695 |
| 7,492,590 B2 * | 2/2009 | Chen et al. | 361/695 |
| 8,059,401 B2 * | 11/2011 | Guan | 361/692 |
| 2002/0053421 A1 * | 5/2002 | Hisano et al. | 165/104.33 |
| 2006/0176672 A1 * | 8/2006 | Kamemoto et al. | 361/714 |
| 2007/0095510 A1 * | 5/2007 | Lin et al. | 165/104.33 |

* cited by examiner

Primary Examiner — Zachary M Pape
(74) Attorney, Agent, or Firm — Altis Law Group, Inc.

(57) ABSTRACT

An exemplary electronic device includes an enclosure, two electronic components received in the enclosure, a heat sink, and a thermal insulation member. The enclosure defines a receiving space for receiving the electronic components and the thermal insulation member. Two ventilating holes are defined in the enclosure. The thermal insulating member defines a heat dissipating passage therein, communicating with the exterior via the ventilating holes of the enclosure. The heat sink is received in the heat dissipating passage and thermally coupled to the electronic components for dissipating heat from the electronic components. The heat dissipating passage is substantially thermally insulated from the part of the receiving space of the enclosure having the electronic components by the thermal insulation member.

14 Claims, 4 Drawing Sheets

ELECTRONIC DEVICE WITH THERMAL INSULATION MEMBER FOR HEAT SINK

BACKGROUND

1. Technical Field

The present disclosure relates to electronic devices, and particularly to an electronic device with a thermal insulation member.

2. Description of Related Art

Heat sinks are usually applied for dissipating heat from electronic components in electronic devices. Generally, airflow, generated by a fan, evacuates heat from the heat sink to the exterior via a ventilating hole defined in an enclosure of the electronic device, providing timely and efficient cooling of the electronic device.

With continued efforts toward miniaturization, all-in-one electronic devices, such as all-in-one computers, are gaining popularity. The enclosure and display of such computers are integrated, such that cooling fans may no longer be applicable, since noise and vibration generated thereby may impair operation or usefulness. As a result, heat sinks without cooling fans are commonly used in all-in-one computers. The heat sink contacts the electronic component directly, absorbing heat therefrom, and dissipates the heat into a space in the enclosure. Heat is dissipated from the space to the exterior via one or more ventilating holes defined in the enclosure by convection only, which may not provide heat dissipation with the requisite timeliness and efficiency.

Thus, it is desired to overcome the described limitations.

DETAILED DESCRIPTION

Figure 1:
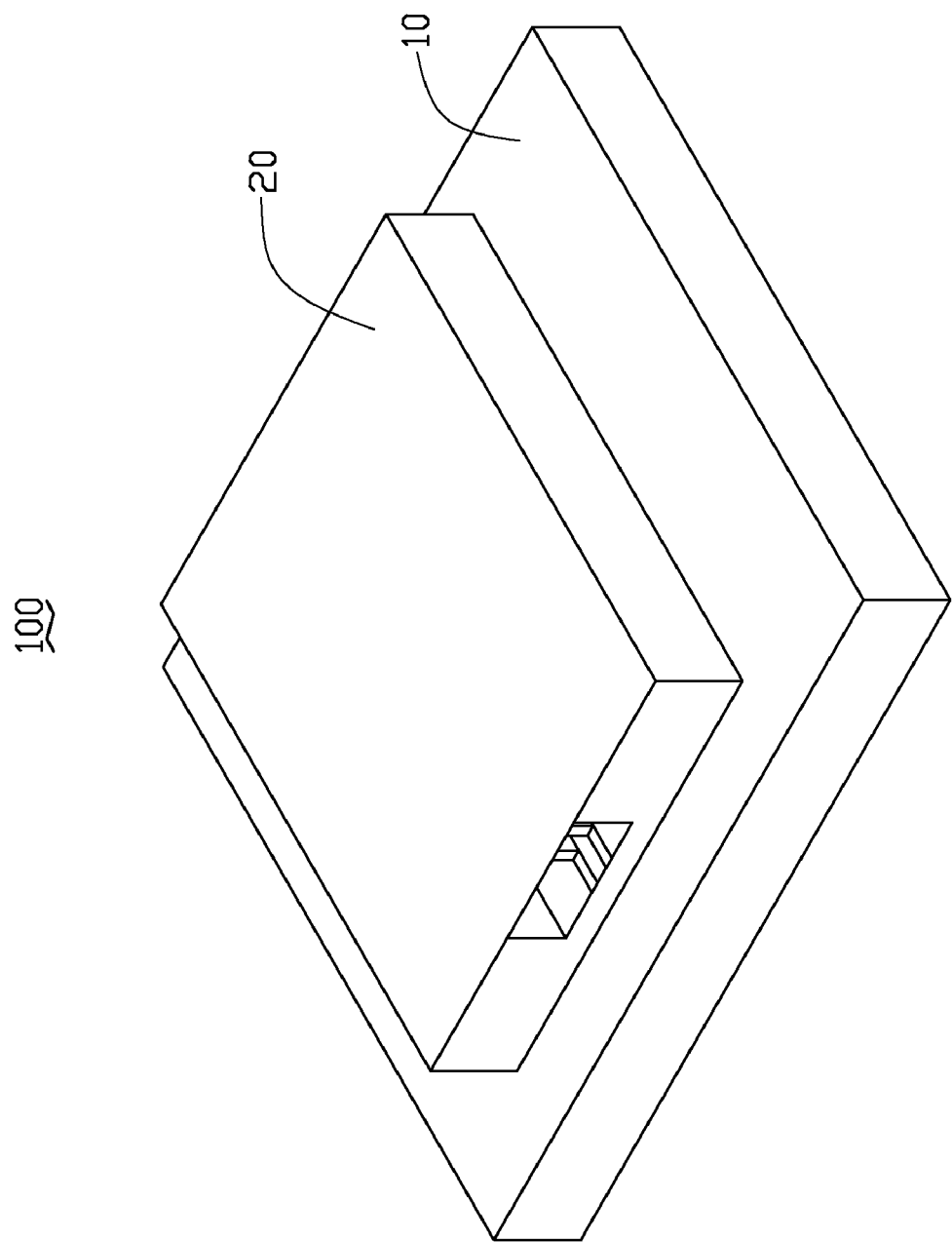
FIG. 1 is an assembled, isometric view of an electronic device in accordance with an exemplary embodiment.
Figure 2:
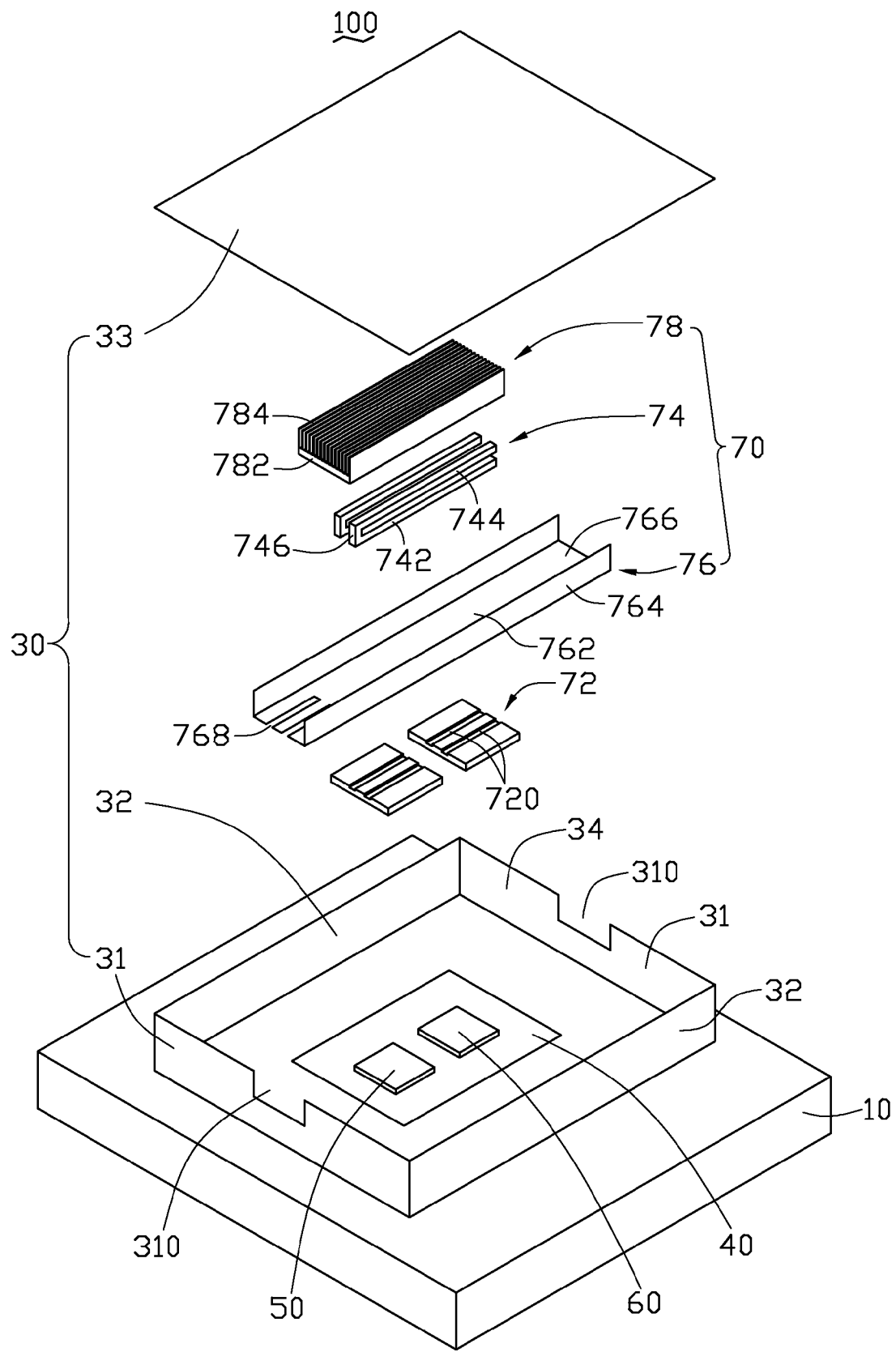
FIG. 2 is an exploded view of the electronic device of FIG. 1.

Referring to FIGS. 1 and 2, an electronic device according to an exemplary embodiment of the present disclosure is shown. In this embodiment, the electronic device is an all-in-one computer 100. The all-in-one computer 100 includes a rectangular chassis 10, a display (not shown) on a bottom side of the chassis 10, and a computer system 20 on a top side of the chassis 10.

The computer system 20 includes an enclosure 30, a circuit board 40 received in the enclosure 30, two electronic components 50, 60 mounted on the circuit board 40, and a thermal module 70 for dissipating heat from the electronic components 50, 60. One of the electronic components 50, 60 is a central processing unit (CPU) 50, and the other is Northbridge chip (NB chip) 60. The circuit board 40 is attached to a top surface of the chassis 10. CPU 50 and NB chip 60 are located in the center of the circuit board 40.

The enclosure 30 includes a pair of parallel first sidewalls 31, a pair of parallel second sidewalls 32, and a cover 33. The first sidewalls 31 and the second sidewalls 32 extend upward from the top surface of the chassis 10. The first sidewalls 31 and the second sidewalls 32 are connected with each other to cooperatively form a hollow rectangular structure. The cover 33 is rectangular, and four side edges of the cover 33 are connected with top edges of the first and second sidewalls 31, 32, respectively. Thus, the top surface of the chassis 10, the first and second sidewalls 31, 32 and the cover 33 cooperatively define a receiving space 34 in the enclosure 30. The CPU 50, the NB chip 60 and the thermal module 70 are received in the receiving space 34.

Each first sidewall 31 defines a U-shaped ventilating hole 310 therein. The ventilating hole 310 extends downward from the top edge of the first sidewall 31 towards the center of the first sidewall 31. A depth of the ventilating hole 310 is less than the height of the first sidewall 31. The ventilating holes 310 of the first sidewalls 31 align.

The thermal module 70 includes two bases 72, two heat pipes 74, a thermal insulation member 76, and a heat sink 78. The bases 72 directly contact the CPU 50 and the NB chip 60. Each base 72 defines two parallel receiving grooves 720. The heat sink 78 includes a substrate 782, and a plurality of spaced fins 784 extending upward from the substrate 782. Each of the heat pipes 74 is U-shaped, and includes an evaporator section 742, a condenser section 744 parallel to the evaporator section 742, and an adiabatic section 746 connecting the evaporator section 742 to the condenser section 744. The evaporator sections 742 of the heat pipes 74 are received in the receiving grooves 720 of the bases 72, respectively, and the condenser sections 744 of the heat pipes 74 are in thermal contact with the substrate 782 of the heat sink 78, thereby transferring heat from the bases 72 to the heat sink 78.

The thermal insulation member 76 is located between the bases 72 and the heat sink 78. The thermal insulation member 76 is elongated, and a length of the thermal insulation member 76 is equal to a distance between the first sidewalls 31. The thermal insulation member 76 is substantially U-shaped in transverse cross section, and of a height substantially equaling the depth of the ventilating hole 310. The thermal insulation member 76 defines a heat dissipating passage 766 therein along a longitudinal axis of the thermal insulation member 76. The heat sink 78 is received in the heat dissipating passage 766 of the thermal insulation member 76. The thermal insulation member 76 is made of material with a lower heat transfer coefficient than the material of the heat sink 78, to avoid heat transfer from the heat dissipating passage 766 into the receiving space 34 of the enclosure 30 outside of the thermal insulation member 76.

The thermal insulation member 76 includes a rectangular first plate 762, and a pair of second plates 764 extending upward from two relatively longer edges of the first plate 762. The second plates 764 are parallel with each other and perpendicular to the first plate 762. The first plate 762 and the second plates 764 cooperatively define the heat dissipating passage 766 in the thermal insulation member 76. The heat dissipating passage 766 has a U-shaped profile in transverse cross section, which is substantially the same as the U-shaped transverse cross section of the ventilating hole 310. Thus, two ends of the heat dissipating passage 766 match the two ventilating holes 310 of the enclosure 30, respectively. The first plate 762 defines two elongated engaging grooves 768 at one end thereof. The engaging grooves 768 extend from a shorter edge of the first plate 762 into the first plate 762 a predetermined relatively short distance.

Figure 3:
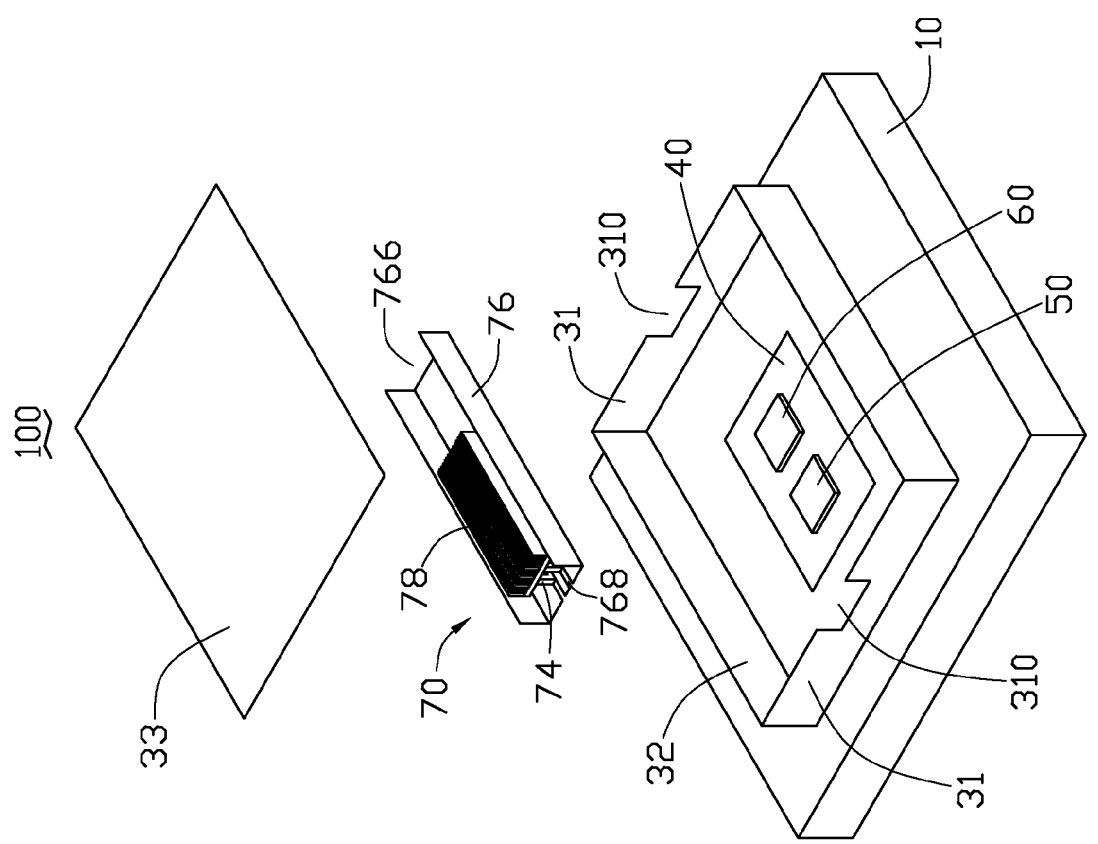
FIG. 3 is a partially assembled view of the electronic device of FIG. 2.
Figure 4:
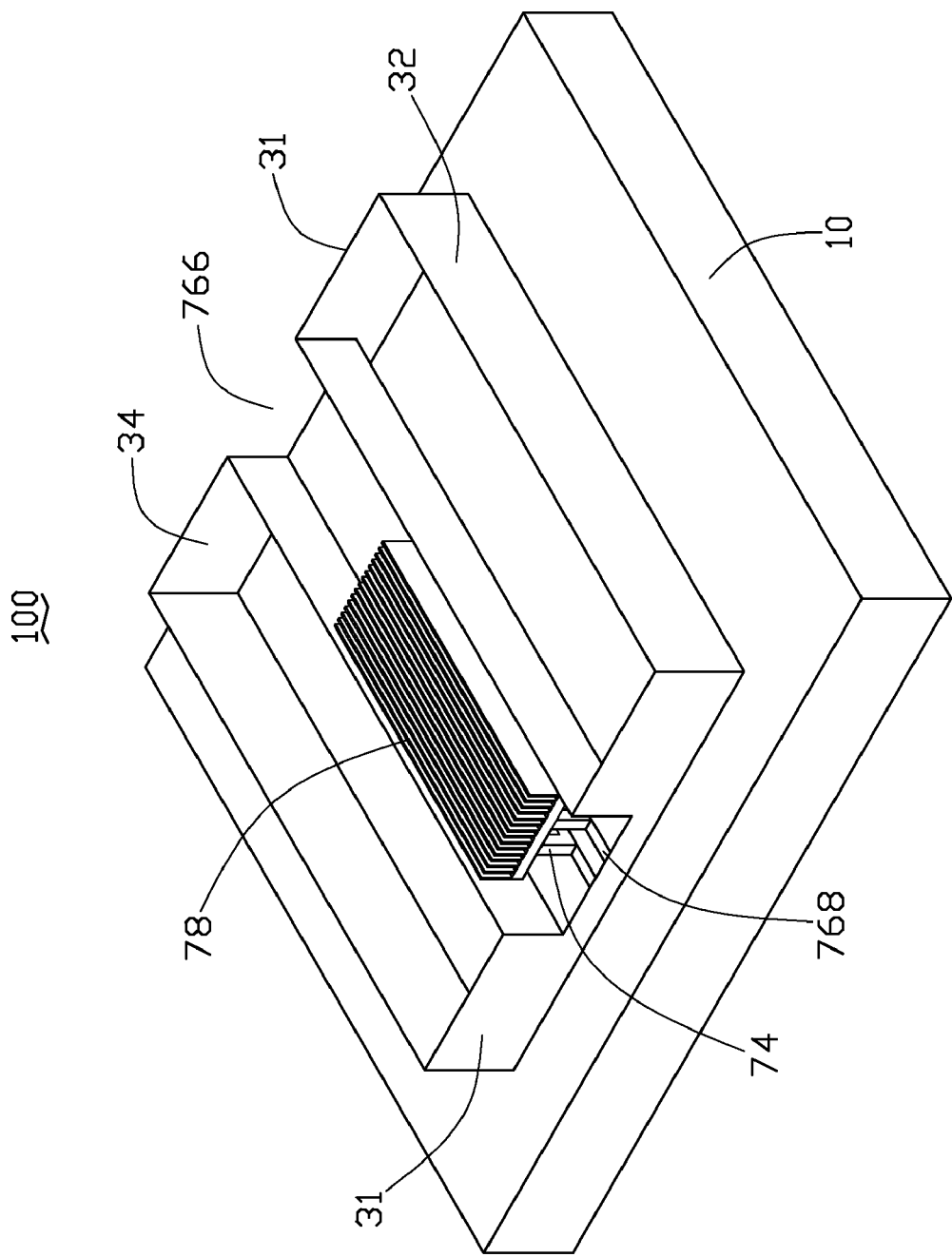
FIG. 4 is an assembled, isometric view of the electronic device of FIG. 2, but omitting a cover thereof for clarity.

Referring also to FIGS. 3 and 4, in assembly of the thermal module 70, the adiabatic sections 746 of the heat pipes 74 are engaged in the engaging grooves 768 of the first plate 762 of the thermal insulation member 76. The evaporator sections 742 of the heat pipes 74 are located below the first plate 762 of the thermal insulation member 76 and thermally contact the bases 72. The condenser sections 744 of the heat pipes 74 are located above the first plate 762 of the thermal insulation member 76 and thermally contact the heat sink 78. The heat sink 78 is received in the heat dissipating passage 766 of the thermal insulation member 76. Thus, the bases 72 and the heat sinks 78 are thermally interconnected with each other by the heat pipes 74.

When the thermal module 70 is received in the enclosure 30, the thermal module 70 is placed above the CPU 50 and the NB chip 60. The bases 72 are in thermal contact with top surfaces of the CPU 50 and the NB chip 60, respectively. Two ends of the thermal insulation member 76 abut against inner surfaces of the first sidewalls 31 beside the ventilating holes 310, respectively. Two ends of the heat dissipating passage 766 of the thermal insulation member 76 align with the ventilating holes 310 of first sidewalls 31, such that the heat dissipating passage 766 communicates with the exterior via the ventilating holes 310 of the first sidewall 31. Top edges of the second plates 764 of the thermal insulation member 76 abut against a bottom surface of the cover 33, such that the heat dissipating passage 766 is thermally insulated from the receiving space 34 of the enclosure 30. In addition, since the thermal insulation member 76 is made of material with a lower heat transfer coefficient than the material of the heat sink 78, heat transferred to the heat sink 78 is prevented from transferring into the receiving space 34 of the enclosure 30.

As the heat dissipating passage 766 communicates with the exterior directly via the ventilating holes 310, and the heat dissipating passage 766 is thermally insulated from the receiving space 34 of the enclosure 30, heat transferred into the heat dissipating passage 766 by the heat sink 78 is dissipated to the exterior directly and quickly. In addition, heat in the heat dissipating passage 766 is kept from transferring to the receiving space 34 of the enclosure 30, and the temperature in the receiving space 34 of the enclosure 30 is thus kept lower for stable performance of the electronic components 50, 60.

It is to be understood, however, that even though numerous characteristics and advantages of the exemplary embodiment(s) have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electronic device, comprising:
    an enclosure defining a receiving space therein, at least one ventilating hole defined in the enclosure;
    at least one electronic component received in the receiving space of the enclosure;
    a heat sink;
    a thermal insulation member received in the receiving space of the enclosure, the thermal insulation member defining a heat dissipating passage therein, the heat dissipating passage communicating with the exterior via the at least one ventilating hole of the enclosure, and the heat sink received in the heat dissipating passage and thermally coupled to the at least one electronic component for dissipating heat from the at least one electronic component, wherein the heat dissipating passage is substantially thermally insulated from the part of the receiving space of the enclosure having the at least one electronic component by the thermal insulation member; and
    at least one base absorbing heat from the at least one electronic component and at least one heat pipe extending through the thermal insulation member, the at least one heat pipe comprising an evaporator section thermally contacting the at least one base and a condenser section thermally contacting the heat sink;
    wherein the thermal insulation member comprises a first plate and a pair of second plates extending from two opposite side edges of the first plate, and the first plate defines at least one engaging groove through which the at least one heat pipe extends; and
    wherein the at least one heat pipe is U-shaped, the evaporator section is parallel to the condenser section, an adiabatic section of the at least one heat pipe is located between the evaporator section and the condenser section, the adiabatic section is received in the at least one engaging groove, the evaporator section is located below the first plate, and the condenser section is located above the first plate.

2. The electronic device of claim 1, wherein the thermal insulation member has a U-shaped profile in transverse cross section.

3. The electronic device of claim 1, wherein top edges of the second plates abut an inner surface of the enclosure.

4. The electronic device of claim 1, wherein the at least one engaging groove is defined in one end of the thermal insulation member and extends from one edge of the first plate into the first plate a predetermined distance.

5. The electronic device of claim 1, wherein the at least one ventilating hole comprises two ventilating holes located respectively at two ends of the heat dissipating passage, and the heat dissipating passage communicates with the exterior via the two ventilating holes.

6. The electronic device of claim 1, wherein the electronic device is an all-in-one computer comprising a chassis attached to the enclosure.

7. The electronic device of claim 6, wherein the enclosure comprises a plurality of sidewalls extending from the chassis and a cover covering the sidewalls, the receiving space is cooperatively defined by the chassis, the sidewalls and the cover, and the at least one ventilating hole is defined in at least one of the sidewalls.

8. The electronic device of claim 7, wherein the sidewalls extend upward from a surface of the chassis, side edges of the cover are connected with top edges of the sidewalls, and a top side of the thermal insulation member abuts an inner surface of the cover.

9. The electronic device of claim 7, wherein the sidewalls comprise a pair of first sidewalls and a pair of second sidewalls, and the first sidewalls and the second sidewalls are connected to form a rectangular structure.

10. The electronic device of claim 9, wherein the at least one ventilating hole is defined in at least one of the first sidewalls, and extends from a top edge of the at least one first sidewall down towards a central area of the at least one first sidewall.

11. An all-in-one computer, comprising:
    a chassis and a computer system attached to the chassis,
    the computer system comprising an enclosure defining a receiving space therein, and a thermal insulation member, at least one electronic component, and a heat sink received in the enclosure, at least one ventilating hole defined in the enclosure,
    the thermal insulation member defining a heat dissipating passage therein, the heat sink received in the heat dissipating passage of the thermal insulating member and thermally coupled to the at least one electronic component, the heat dissipating passage thermally insulated from the part of the receiving space of the enclosure having the at least one electronic component by the thermal insulation member, the heat dissipating passage communicating with the exterior via the at least one ventilating hole, wherein the computer system further comprises at least one base absorbing heat from the at least one electronic component and at least one heat pipe extending through the thermal insulation member, the at least one heat pipe comprising an evaporator section thermally contacting the at least one base and a condenser section thermally contacting the heat sink;

wherein the thermal insulation member comprises a first plate and a pair of second plates extending from two opposite side edges of the first plate, and the first plate defines at least one engaging groove through which the at least one heat pipe extends; and wherein the at least one heat pipe is U-shaped, the evaporator section is parallel to the condenser section, an adiabatic section of the at least one heat pipe is located between the evaporator section and the condenser section, the adiabatic section is received in the at least one engaging groove, the evaporator section is located below the first plate, and the condenser section is located above the first plate.

12. The all-in-one computer of claim 11, wherein the thermal insulation member has a U-shaped profile in transverse cross section.

13. The all-in-one computer of claim 11, wherein top edges of the second plates abut an inner surface of the enclosure.

14. The all-in-one computer of claim 11, wherein the at least one ventilating hole comprises two ventilating holes located respectively at two ends of the heat dissipating passage, and the heat dissipating passage communicates with the exterior via the two ventilating holes.

* * * * *